United States Patent
Sun et al.

(10) Patent No.: US 6,857,387 B1
(45) Date of Patent: Feb. 22, 2005

(54) MULTIPLE FREQUENCY PLASMA CHAMBER WITH GROUNDING CAPACITOR AT CATHODE

(75) Inventors: Sheng Sun, San Jose, CA (US); Jeff C. Olsen, Los Gatos, CA (US); Sanjay Yadav, Redwood City, CA (US); Quanyuan Shang, Saratoga, CA (US); Kam S. Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/563,963

(22) Filed: May 3, 2000

(51) Int. Cl.[7] .................. C23C 16/509; C23C 16/505; C23F 1/00; H01L 21/306
(52) U.S. Cl. ................. 118/723 E; 118/723 R; 156/345.43; 156/345.44
(58) Field of Search .................. 118/723 E, 723 ER; 156/345, 345.43, 345.47, 345.44; 315/111.21, 111.31, 111.41, 111.51, 111.61, 111.71

(56) References Cited

U.S. PATENT DOCUMENTS

| | | | | |
|---|---|---|---|---|
| 5,170,098 A | * | 12/1992 | Dutton et al. ............ | 156/345 |
| 5,210,466 A | * | 5/1993 | Collins et al. ............ | 156/345 |
| 5,272,417 A | * | 12/1993 | Ohmi .................... | 156/345.47 |
| 5,288,971 A | * | 2/1994 | Knipp ................... | 204/298.08 |
| 5,487,785 A | * | 1/1996 | Horiike et al. ............ | 118/723 E |
| 5,534,751 A | * | 7/1996 | Lenz et al. ............ | 156/345.43 |
| 5,688,330 A | * | 11/1997 | Ohmi .................... | 118/723 E |
| 5,705,019 A | | 1/1998 | Yamada et al. | |
| 5,815,047 A | * | 9/1998 | Sorensen et al. ........ | 315/111.21 |
| 5,891,349 A | * | 4/1999 | Tobe et al. ............ | 216/68 |
| 6,024,044 A | | 2/2000 | Law et al. ............ | 118/723 E |
| 6,041,734 A | | 3/2000 | Raoux et al. | |
| 6,098,568 A | * | 8/2000 | Raoux et al. ............ | 118/723 E |
| 6,112,697 A | | 9/2000 | Sharan et al. | |
| 6,162,709 A | | 12/2000 | Raoux et al. | |
| 6,202,590 B1 | * | 3/2001 | Kim et al. ............ | 118/723 R |
| 6,227,141 B1 | | 5/2001 | Sharan et al. | |
| 6,270,618 B1 | * | 8/2001 | Nakano et al. .......... | 118/723 E |
| 2002/0025388 A1 | * | 7/2001 | Bhardwaj et al. .......... | 427/569 |

FOREIGN PATENT DOCUMENTS

| | | | | |
|---|---|---|---|---|
| EP | 0 678 903 A1 | * | 4/1995 | |
| EP | 0 845 800 A1 | | 3/1998 | |
| JP | 6-260425 | | 9/1994 | |
| JP | 0708638 A | * | 3/1995 | ........... C23C/16/50 |
| JP | 7-106314 | | 4/1995 | |
| WO | WO 99/28524 | | 6/1999 | |
| WO | WO 99/43017 | | 8/1999 | |

OTHER PUBLICATIONS

Examiner's action mailed Apr. 3, 2002 in Taiwan patent application 90110556.
Search report mailed Aug. 23, 2002 in Singapore patent application 200102628-5.

* cited by examiner

Primary Examiner—Gregory L. Mills
Assistant Examiner—Rudy Zervigon
(74) Attorney, Agent, or Firm—Robert J. Stern

(57) ABSTRACT

An apparatus and method for fabricating an electronic workpiece in which first and second electrodes within a plasma chamber are respectively connected to low frequency and high frequency RF power supplies. At least one capacitor is connected between the first electrode and electrical ground. The one or more capacitors can reduce or eliminate the coupling of high frequency RF power to any plasma outside the region directly between the two electrodes. Consequently, the invention can improve the performance of the plasma process by concentrating more of the RF power in the region between the two electrodes.

33 Claims, 2 Drawing Sheets

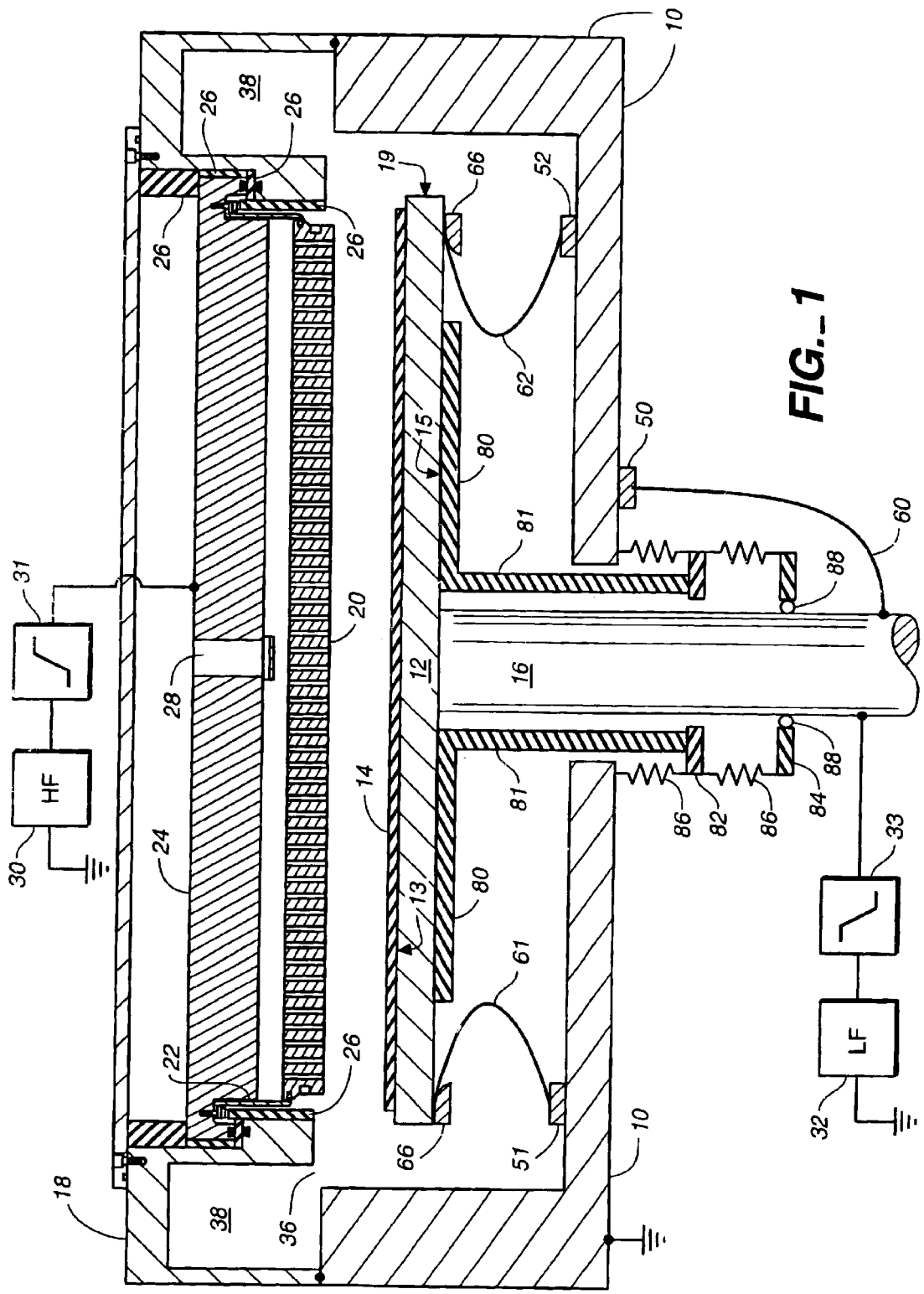
FIG._1

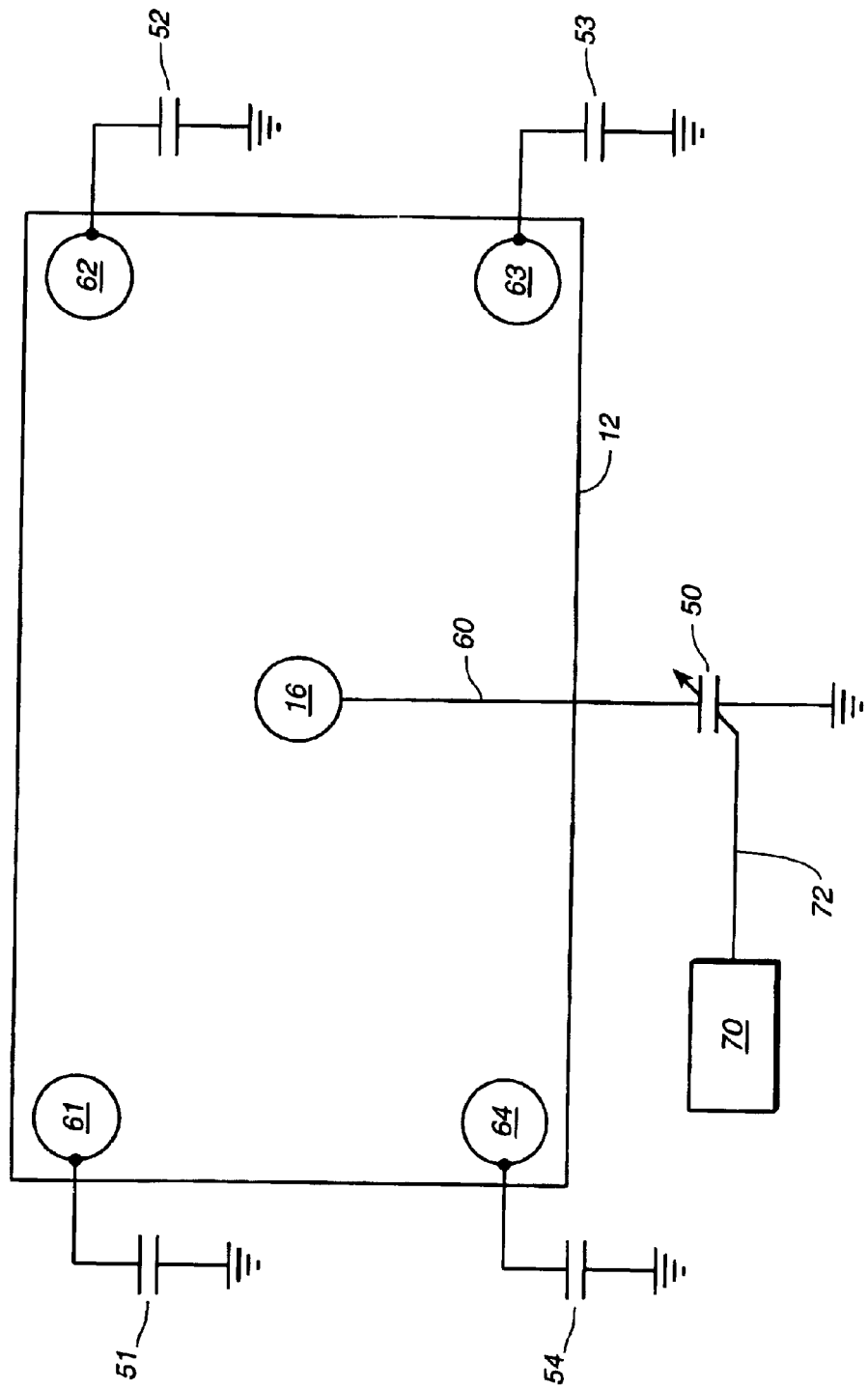
FIG._2

MULTIPLE FREQUENCY PLASMA CHAMBER WITH GROUNDING CAPACITOR AT CATHODE

FIELD OF THE INVENTION

The invention relates generally to plasma chambers for fabricating electronic substrates in which the plasma is excited by RF power applied between anode and cathode electrodes. More specifically, the invention relates to such a chamber in which the anode and cathode receive RF power at different frequencies, and a capacitor is connected between the cathode electrode and electrical ground.

BACKGROUND OF THE INVENTION

Electronic devices, such as flat panel displays and integrated circuits, commonly are fabricated by a series of process steps in which layers are deposited on a substrate and the deposited material is etched into desired patterns. The process steps commonly include plasma enhanced chemical vapor deposition (CVD) processes and plasma etch processes.

Plasma processes require supplying a process gas mixture to a vacuum chamber called a plasma chamber, and then applying electrical or electromagnetic power to excite the process gas to a plasma state. The plasma decomposes the gas mixture into ion species that perform the desired deposition or etch process.

In capacitively excited process chambers, the plasma is excited by RF power applied between an anode electrode and a cathode electrode. Generally the substrate is mounted on a pedestal or susceptor that functions as the cathode electrode, and the anode electrode is mounted a short distance from, and parallel to, the substrate.

Commonly the anode electrode also functions as a gas distribution plate for supplying the process gas mixture into the chamber. The anode electrode is perforated with hundreds or thousands of orifices through which the process gas mixture flows into the gap between the anode and cathode. The orifices are spaced across the surface of the gas distribution plate so as to maximize the spatial uniformity of the process gas mixture adjacent the substrate. Such a gas distribution plate, commonly called a "shower head", is described in commonly assigned U.S. Pat. No. 4,854,263 issued Aug. 8, 1989 to Chang et al.

The RF excitation of the plasma may be accomplished by connecting one of the two electrodes (i.e. either the anode or the cathode) to the output of an RF power supply and connecting the other electrode to electrical ground. However, many commonly used plasma enhanced CVD and etch processes require RF excitation at two different frequencies simultaneously, with a high frequency RF power supply being connected to the anode electrode and a low frequency RF power supply being connected to the cathode electrode (or vice versa).

We found that connecting the cathode electrode (the susceptor) and the anode electrode (the gas distribution plate) to separate power supplies, so that neither electrode is electrically grounded, can degrade process performance because some RF power can be coupled between one of these electrodes and electrically grounded chamber components such as the electrically grounded chamber wall. This diverts RF power from the region between the susceptor and the gas distribution plate where the RF power is required to perform the desired plasma enhanced CVD or etch process. In the case of a CVD process for depositing a film such as silicon nitride or silicon oxide, we found that such diversion of RF power to a plasma behind or alongside the susceptor can produce a film having undesirable properties such as tensile film stress, low density, and excessive hydrogen content.

SUMMARY OF THE INVENTION

The invention is a plasma chamber apparatus and method for fabricating an electronic workpiece or substrate that is mounted between two electrodes within the chamber. A low frequency RF power supply supplies power to the first electrode, and a high frequency RF power supply supplies power to the second electrode.

Unlike conventional designs, the invention further includes one or more capacitors connected between the first electrode and electrical ground. The one or more capacitors can reduce or eliminate the coupling of high frequency RF power to any plasma outside the region directly between the two electrodes. Consequently, the invention can improve the performance of the plasma process by concentrating more of the RF power in the region between the two electrodes. In CVD processes in particular, the invention enables the deposition of a film having high density, a desirable degree of compressive stress rather than tensile stress, and other desirable film qualities.

The invention is especially valuable when the workpiece or substrate is a dielectric material, such as a glass substrate for fabricating flat panel displays, mounted on or adjacent to the first electrode. In comparison with a semiconductor substrate, a dielectric substrate interposes a greater RF impedance between the first electrode and the plasma body, which increases the risk of forming a secondary plasma body by coupling RF power through an alternative RF current path alongside or behind the first electrode.

The invention also is especially valuable when the workpiece is very large, such as 550×650 mm or larger substrates used for fabricating flat panel displays. For larger substrates, a preferred embodiment of the invention employs a plurality of capacitors connected to respective contact areas distributed over the perimeter or back side of the first electrode.

BRIEF DESCRIPTION OF THE DRAWINGS

FIG. 1 is a partially schematic, sectional side view of a plasma chamber including grounding capacitors according to the invention.

FIG. 2 is a partially schematic bottom view of a susceptor showing contact areas where capacitors are connected.

DETAILED DESCRIPTION OF THE PREFERRED EMBODIMENTS

Plasma Chamber

FIG. 1 shows a plasma chamber that includes capacitors connected between the cathode electrode and ground according to the present invention. The conventional features of the chamber will be described before describing the details of our invention.

The invention is useful in plasma chambers for fabricating or treating any kind of electronic substrate or workpiece, such as a silicon wafer or a glass substrate for a flat panel display. The illustrated chamber is designed for performing plasma-enhanced chemical vapor deposition (CVD) of films onto glass substrates. However, the invention also is useful in chambers for performing other plasma-assisted processes such as plasma etching.

The plasma chamber or vacuum chamber has a housing or wall 10 that encloses the side and bottom of the chamber interior and is electrically grounded. A metal pedestal or susceptor 12 functions as a cathode electrode and has a front surface 13 that supports a workpiece or substrate 14. We refer to the opposite surface of the susceptor as its rear surface 15.

Alternatively, the workpiece need not directly contact the susceptor, but may be held a short distance from the front surface of the susceptor by, for example, a plurality of lift pins, not shown. We use the term "chuck" to refer to whatever means is used to hold the workpiece in position on or near the front surface of the susceptor. The susceptor itself is the chuck if the workpiece simply rests on the susceptor. More typically, the workpiece is held onto the susceptor by a clamp ring or rectangular shadow frame placed over the periphery of the workpiece or by an electrostatic chuck embedded in the susceptor.

A hollow, cylindrical metal conduit or shaft 16 extends downward from the center of the susceptor and passes through the bottom wall of the chamber. The primary function of the conduit or shaft is to enclose wiring that provides power to an electrical heater and/or an electrostatic chuck that may be embedded in the susceptor.

In the illustrated preferred embodiment, the susceptor center shaft 16 is attached directly to the susceptor without any intervening insulator, so that the shaft is RF hot and functions as part of the RF transmission line connecting the LF power supply to the susceptor. The shaft is electrically insulated from the electrically grounded chamber wall by a cylindrical dielectric 81, described below. An alternative design, not shown, would be to electrically ground the shaft and insulate it from the susceptor by a dielectric spacer between the shaft and the susceptor. In that case, an RF transmission line could be provided within the hollow shaft to connect the LF power supply to the susceptor.

The chamber interior is enclosed on the top by a removable lid 18 in the center of which is mounted a gas inlet manifold. The gas inlet manifold includes a perforated gas distribution plate or showerhead 20, an inlet manifold side wall 22, and a backing plate 24. The gas distribution plate is perforated with hundreds or thousands of orifices, and it is composed of electrically conductive material so it can function as an anode electrode. So that it can receive RF power, the gas inlet manifold 20–24 is insulated from the electrically grounded lid 18 and chamber wall 10 by dielectric spacers 26.

Process gases are supplied to the gas inlet manifold through a gas inlet orifice 28 in the backing plate. The gases then flow through the orifices in the gas distribution plate so as to enter the region of the chamber interior between the gas distribution plate and the susceptor 12.

RF power is supplied to the gases within the chamber by two RF power supplies operating at two different RF frequencies. A typical operating frequency for the higher frequency RF power supply 30, called the HF power supply, is 13 MHz. A typical operating frequency for the lower frequency RF power supply 32, also called the "bias" or LF power supply, is 400 kHz.

Each power supply produces an output voltage between two output terminals, one of which is electrically grounded. The grounded output of each power supply is connected to the electrically grounded chamber wall 10. In the illustrated CVD chamber, the ungrounded output of the LF power supply 32 is electrically connected to the susceptor 12, which functions as a cathode electrode. The ungrounded or "hot" output terminal of the HF power supply 30 is electrically connected to the gas distribution plate 20, which functions as an anode electrode. (As shown in FIG. 1, the RF cable that electrically connects the HF power supply to the gas distribution plate 20 can be physically connected to the backing plate 24, which is electrically connected to the gas distribution plate through the electrically conductive manifold side wall 22.) For some semiconductor fabrication processes, especially etch processes, the HF and LF power supplies are interchanged relative to the illustrated CVD chamber; i.e., the HF and LF power supplies are connected to the cathode electrode (susceptor 12) and anode electrode (gas distribution plate 20), respectively.

Depending on the design of the LF power supply 32 and its impedance matching network, it may be necessary to connect a low pass filter 33 in series between the LF power supply and the cathode electrode 12. Without such a low pass filter, the HF power could confuse or perturb the matching network of the LF power supply and prevent it from achieving a proper impedance match. The low pass filter should have a cutoff frequency between the frequencies of the HF and LF power supplies so as to block the HF power from being coupled to the LF power supply.

A high pass filter 31 also could be inserted between the HF power supply and the anode electrode in order to block the LF power from being coupled to the HF power supply. The high pass filter may be unnecessary if the LF power level is much lower than the HF power level, as in the CVD process described below.

The RF power applied between the cathode electrode (the susceptor 12) and the anode electrode (the gas distribution plate 20) produces an electromagnetic field in the region between the two electrodes that excites the gases in that region to a plasma state. The plasma produces reactive species from the process gas mixture that react with exposed material on the workpiece to perform a desired deposition or etch process.

A vacuum pump, not shown, maintains a desired level of vacuum within the chamber and exhausts the process gases and reaction products from the chamber through an annular exhaust slit 36, then into annular exhaust plenum 38, and then through an exhaust channel, not shown, to the pump.

(Throughout this patent specification, the term "annular" is not limited to an object having a circular perimeter, but is intended to mean any object bounded by two concentric closed paths. The illustrated chamber has a rectangular cross section because it is intended for fabricating rectangular substrates, hence the annular exhaust slit and exhaust plenum have inner and outer perimeters that are rectangular.)

A motorized lift mechanism 80-88 moves the susceptor to a lower position (not shown) while a workpiece is being transferred into or out of the chamber and to an upper position (FIG. 1) while a plasma process is being performed on the workpiece. Specifically, the susceptor 12 is supported at its center by a ceramic support shelf 80. The support shelf includes a cylindrical center section 81 that surrounds the susceptor shaft 16 and extends downward through an opening in the chamber bottom wall. The center section 81 of the support shelf rests on a movable lift platform 82. A motor, not shown, controllably moves the lift platform up and down relative to a fixed base plate 84, thereby raising and lowering the susceptor 12 and the susceptor shaft 16.

A bellows 86 and O-ring 88 provide a vacuum seal around the opening in the chamber wall through which the susceptor shaft 16 extends while accommodating vertical movement of the shaft.

All of the chamber components described above should be composed of materials that will not contaminate the semiconductor fabrication processes to be performed in the chamber and that will resist corrosion by the process gases. Anodized aluminum is our preferred material for all the components other than the ceramic spacer 26 and the ceramic components 80–84 of the lift mechanism.

All portions of the plasma chamber described above are conventional. The design and operation of conventional plasma CVD and etch chambers are described in the following commonly-assigned U.S. patents, the entire content of each of which is hereby incorporated by reference in this patent specification: U.S. Pat. No. 4,854,263 issued Aug. 8, 1989 to Chang et al.; U.S. Pat. No. 5,356,722 issued Jul. 18, 1994 to Nguyen et al.; U.S. Pat. No. 5,755,886 issued May 26, 1998 to Wang et al.; U.S. Pat. No. 5,773,100 issued Jun. 30, 1998 to Chang et al.; U.S. Pat. No. 5,844,205 issued Dec. 1, 1998 to White et al.; and U.S. Pat. No. 6,024,044 issued Feb. 15, 2000 to Law et al.

Capacitor Connected Between Susceptor and Ground

Unlike conventional plasma chambers, ours includes one or more capacitors 50–54 connected between the susceptor 12 (i.e., the cathode electrode) and electrical ground. (See FIGS. 1 and 2.) The capacitors reduce or eliminate the coupling of RF power to any plasma behind the cathode or outside the periphery of the cathode. In other words, the capacitors reduce the intensity of such unwanted plasma, preferably to zero. This improves the performance of the chemical process being performed in the chamber by concentrating more of the RF power in the region into which the process gases are dispensed, namely, the region between the susceptor electrode) and the gas distribution plate 20 (anode electrode). We also discovered that the capacitors can improve the spatial uniformity of the plasma within such region so as to minimize or eliminate localized regions of lower or higher plasma density, thereby improving the spatial uniformity of the deposition or etch process being performed on the workpiece. In dielectric CVD processes in particular, this increased concentration and uniformity of RF power enables the deposition of a film having a desirable degree of compressive stress rather than tensile stress, high density, and other desirable film qualities.

In a conventional plasma chamber without any capacitor between the cathode electrode and ground, the only path from the cathode to ground at the frequency of the HF signal is the output impedance of the LF power supply 32. In our invention, the capacitors 50–54 provide a path from the cathode to ground that has a low impedance at the frequency of the HF power supply 30. Although our invention is not limited to a specific theory of operation, we believe this low impedance path to ground provided by capacitors 50–54 reduces the HF voltage between the cathode and the nearby areas of the chamber wall 10, thereby reducing or eliminating the coupling of the HF power between the susceptor and any plasma behind the cathode or outside the perimeter of the cathode.

The invention is especially valuable when the workpiece or substrate 14 is a dielectric material, such as a glass substrate for fabricating flat panel displays. Specifically, such a workpiece generally consists of a number of semiconductor, conductor, and dielectric layers formed on a dielectric substrate such as glass. Consequently, the majority of the material of the workpiece is dielectric. In comparison with a semiconductor substrate, a dielectric substrate interposes a greater RF impedance between the cathode electrode 12 and the plasma body, which increases the risk of forming a secondary plasma body by coupling RF power through an alternative RF current path alongside or behind the cathode electrode.

Defined broadly in terms of its electrical impedance, the combined capacitance value of the capacitors 50–54 connected between the susceptor and ground should be great enough to substantially reduce the electrical impedance between the susceptor and ground at the frequency of the HF power supply 30 in comparison with what such impedance would be in the absence of the capacitors. Preferably, the combined capacitance should be large enough to effectively provide a direct electrical connection between the susceptor and ground at the HF frequency.

Defined broadly in terms of its effect on the desired plasma between the cathode and anode electrodes, the capacitance should be great enough to substantially increase the intensity of such plasma relative to what its intensity would be in the absence of the capacitance.

Alternatively, defined broadly in terms of its effect on the unwanted plasma, the capacitance should be great enough to substantially reduce the intensity of any plasma behind or outside the periphery of the cathode electrode relative to the intensity of such plasma in the absence of the capacitance.

In any event, the combined capacitance 50–54 should not be so great that the electrical impedance between the cathode 12 and ground at the frequency of the LF power supply 32 is so low that the LF power supply 32 and its impedance matching network cannot couple substantial RF power to the susceptor. In other words, the capacitance should not be large enough to electrically short circuit the susceptor to ground at the LF frequency.

Furthermore, we found that the combined capacitance value of the capacitors connected between the cathode electrode and ground typically has an optimum value that maximizes the spatial uniformity of the density of the plasma in the region directly between the cathode and anode electrodes. As will be explained below, this optimum capacitance value preferably should be determined empirically so as to optimize the desired process performance parameters and so as to minimize plasma non-uniformities, i.e., localized regions of relatively high or low density plasma.

So that the combined capacitance 50–54 can have a substantially lower impedance at the frequency of the HF power supply than at the frequency of the LF power supply, the frequencies of the two power supplies preferably differ by a factor of at least 2, and more preferably by a factor of at least 10.

Our presently preferred implementation of the invention includes a capacitor 50 connected between electrical ground and the center of the susceptor and four additional capacitors 51–54 connected between each of the four corners of the rear surface 15 of the susceptor and electrical ground. Each of the five capacitors preferably is connected to the susceptor by a respective strap 60–64 that is flexible and electrically conductive. (See FIGS. 1 and 2.) The conductive straps are flexible in order to accommodate the vertical movement of the shaft and susceptor as described earlier. For example, each strap can be a sheet or band of a pliable metal that is thin and long enough to be flexible and accommodate the full range of motion of the shaft and susceptor. In our prototype, each strap was an aluminum band about 0.5 inch wide and 1/16 inch thick.

All capacitors preferably are a ceramic type designed for high power RF applications, with their electrical connections made by screws through threads in the capacitor terminals. One terminal of each corner capacitor 51–54 is bolted onto the electrically grounded bottom wall of the chamber so that each capacitor is flush with the chamber wall in order to minimize the surface area of the capacitor that is exposed to process gases. The other terminal of each corner capacitor is bolted to a corresponding metal strap 61–64 that is bolted or clamped to the rear surface 15 of the susceptor. In our prototype, four aluminum blocks 66 with curved sides are respectively bolted to the four corners of the susceptor, and each metal strap 61–64 is sandwiched between the susceptor and one of the blocks. The bolts are tightened so that the blocks firmly clamped the metal straps to the susceptor.

In order to provide a low impedance contact area at each of the four corners of the susceptor 12 where the four flexible, conductive straps 61–64 were mounted, we masked the contact areas before anodizing the aluminum susceptor so that clean aluminum was exposed at a contact area at each of the four corners. FIG. 2 shows the contact areas where the four straps 614 are attached to the underside of the susceptor. The four capacitors 51–54 connected to the four straps are shown schematically. FIG. 2 also shows schematically a variable capacitor 50 connected to the center of the susceptor via a flexible, conductive strap 60 and the center shaft 16, as described below.

Alternatively, instead of connecting the straps to the rear surface 15 of the susceptor, the straps could be connected to the peripheral surface 19 of the susceptor near each of the four corners.

Another possible implementation would be to bolt only one capacitor to the electrically grounded chamber wall in place of the four capacitors 51–54. That one capacitor would be connected to each of the four straps 61–64 that connect to the four respective corners of the susceptor.

As stated above, the susceptor support shaft 16 is attached directly to the susceptor without any intervening insulator, so that the shaft is RF hot and functions as part of the RF transmission line connecting the LF power supply to the susceptor. Therefore, the center capacitor 50 can be effectively connected to the center of the susceptor by connecting the capacitor to the shaft. Furthermore, the connection to the shaft can be made to the lower portion of the shaft that is below the vacuum seal (bellows 86 and O-ring 88) so as to be outside the chamber vacuum. This permits mounting the center capacitor on the underside of the chamber wall or on some other electrically grounded component that is outside the vacuum of the chamber interior. This is desirable to avoid any exposure of the center capacitor to the plasma within the chamber, which facilitates the use of a large variable capacitor for the center capacitor. To accommodate vertical motion of the shaft, the center capacitor preferably is connected to the shaft using a flexible metal strap 60 similar to the straps 6–64 that connect the other capacitors to the susceptor.

The invention also can be implemented with only a center capacitor 50 and no corner capacitors 51–54, or else only corner capacitors and no center capacitor. The ratio between the corner (or peripheral) capacitors and the capacitors connected to or near the center of the susceptor will affect the spatial uniformity of the deposition or etch process being performed on the workpiece 14. The larger the width or surface area of the workpiece is, the greater the number of capacitors that are expected to be required to achieve a given level of spatial uniformity for the semiconductor fabrication process to be performed on the workpiece. Additional capacitors connected to points spatially distributed around the periphery of the susceptor, or even to other points spatially distributed over the rear surface of the susceptor, may be desirable for susceptors larger than the 550×650 mm susceptor we tested.

In our preferred embodiment in which the frequencies of the HF and LF power supplies were 13.56 MHz and 400 kHz, respectively, we obtained good results with three or four corner capacitors of 150 pf to 300 pf each and a center capacitor in the range of 300 to 1700 pf. In other words, the combined capacitance ranged from 750 pf to 3000 pf.

Preferably the LF power supply 32 should include a power regulator programmed to slowly increase the forward power (rather than the load power) when the power supply is first turned on, in order to avoid a sudden increase in power that could cause arcing in the plasma chamber.

At relatively high RF power levels, it may be more important to select an optimum capacitance value that maximizes the spatial uniformity of the density of the plasma so as to avoid plasma non-uniformities, i.e., localized regions of relatively low or high-density plasma such as hot spots. For example, in tests using a total RF power from the two power supplies ranging from 2800 to 4500 watts, we adjusted the combined capacitance by adjusting the value of the center capacitor 50, which was a 400–1700 pf variable capacitor. We found that a capacitance too low could cause visibly apparent hot spots in the plasma near the bottom of the susceptor support shaft or near a corner of the shower head 20. Conversely, we found that a capacitance too high could cause hot spots in the plasma in other areas near the bottom of the chamber or near the grounding straps 55 connected to the corner capacitors.

We tested the invention in the plasma chamber shown in FIG. 1 with an otherwise conventional CVD process for depositing a silicon nitride dielectric film on a 550 mm×650 mm rectangular glass substrate of the type typically used for making flat panel displays. The frequencies of the HF and LF power supplies were 13.56 MHz and 400 kHz, respectively. The process gas flow rates were 400 sccm $SiH_4$, 1400 sccm $NH_3$ and 4000 sccm $N_2$, and the chamber pressure was 1.5 to 1.8 torr.

Each of the corner capacitors 51–54 was 150 pf, and we tested four different values of the center shaft capacitor 50. The total RF power supplied by the two power supplies was 2800 W, with either 2400 watts HF and 400 watts LF, or else 2600 watts HF and 200 watts LF.

In three separate tests with a center capacitor of 300 pf, 600 pf, and 900 pf, respectively, the deposition rate progressively increased from 1460 to 2210 Å/min., the wet etch rate progressively decreased from 893 to 375 Å/min., and the film stress changed from +2.6 (tensile) to −4.3 (compressive)×$10^9$ dyne/$cm^2$. Excluding the outer 20 mm of the substrate perimeter, the film thickness uniformity was 14% in the first two cases and 4% in the last case. Therefore, the 900 pf center capacitor produced the best results.

In the same series of tests, the center capacitor was further increased to 1200 pf, but one of the four corner capacitors was removed. Surprisingly, many of the test results were worse than those for the 300 pf center capacitor. The deposition rate fell to 1160 Å/min., wet etch rate increased to 1295 Å/min., and the stress increased to +3.65×$10^9$ dyne/$cm^2$. This test result illustrates the desirability of performing empirical tests to determine the optimum value of the total capacitance as well as the optimum ratio of central capacitance to peripheral (e.g., corner) capacitance.

In practice, the plasma impedance varies widely as a function of process parameters such as RF power, chamber pressure, process gas flow rates, and the dimensions and geometry of the chamber components. Therefore, the optimum value of the combined capacitance connected between the cathode electrode and ground should be chosen empirically. Furthermore, the plasma impedance changes during the course of performing a deposition or etch process on a workpiece, because the thickness of the film being deposited or etched progressively increases or decreases during the process, and because the proportions of reagents and reaction byproducts in the plasma also can change during the process. Consequently, in some processes it may be desirable to progressively adjust the value of the total capacitance between the susceptor and ground—by adjusting one or more of the capacitors 50–54—during the course of performing the process on a given workpiece.

For example, in our tests of the silicon nitride CVD process described above, we found that for every fixed value that we tested for the center capacitor, there was a time interval during the course of performing the CVD process in which the plasma was sufficiently non-uniform that hot spots in the plasma were visibly apparent. Therefore, for this CVD process, we believe it would have been preferable to progressively adjust the value of at least one of the capacitors as the thickness of the deposited silicon nitride film progressively increased during the CVD process.

Consequently, our preferred embodiment includes a controller circuit 70, such as a programmable microprocessor, that periodically sends electrical control signals to a servo motor that controls the setting of one or more variable capacitors that collectively determine the total capacitance 50–54 between the cathode electrode and electrical ground. As stated above, we believe it is simplest to adjust the total capacitance by adjusting only one of the five capacitors, namely, the 400–1700 pf variable center capacitor 50. The controller commands the motor to progressively change the capacitance value of the center capacitor as a function of deposition time or as a function of the thickness of the layer being deposited (or alternatively, etched) by the plasma process.

The amount by which the capacitance is changed preferably should be determined empirically so as to avoid plasma hot spots and maximize the quality of the deposited film. Specifically, the optimum capacitance values as a function of time or layer thickness can be empirically determined during the performance of the deposition or etch process by manually adjusting the capacitance to the extent necessary to avoid visibly apparent or otherwise detectable hot spots in the plasma. The empirically determined series of capacitance values then can be stored as program steps in the controller 70.

Alternatively, the capacitance can be adjusted so that the RF impedance of the plasma is as constant as possible during the performance of the deposition or etch process. The plasma impedance can be inferred from a measurement of the load impedance at the output of one of the two RF power supplies.

In the illustrated CVD chamber, the low frequency RF power supply 32 and the grounding capacitors 50–54 are connected to the susceptor electrode 12 on which the workpiece 14 is mounted. However, in some plasma chambers, such as some etch chambers, the high frequency power supply 30 connects to the susceptor on which the workpiece is mounted, and the low frequency power supply connects to the anode electrode 20. In such a case, the one or more capacitors 50–54 would be connected between electrical ground and the anode electrode, that is, the electrode to which the low frequency power supply is connected.

What is claimed is:

1. Apparatus for fabricating a workpiece, comprising:

a plasma chamber;

first and second electrodes mounted within the plasma chamber;

a chuck for positioning a workpiece between the first and second electrodes;

a low frequency power supply connected to supply to the first electrode an electrical signal having a first frequency;

a high frequency power supply connected to supply to the second electrode an electrical signal having a second frequency that is substantially higher than the first frequency;

one or more capacitors connected to the first electrode at a plurality of spatially distributed locations on the first electrode, wherein each capacitor is connected between the first electrode and electrical ground;

wherein the high and low frequency power supplies in combination excite a plasma in a region between the first and second electrodes; and wherein the spatial distribution of said locations and the respective capacitances of said one or more capacitors are established so as to substantially increase the spatial uniformity of the density of said plasma in said region relative to the spatial uniformity of the density of said plasma in the absence of the one or more capacitors.

2. Apparatus according to claim 1, wherein the at least one capacitor comprises a plurality of capacitors respectively connected to the first electrode at respective spatially distributed locations near the perimeter of the first electrode.

3. Apparatus according to claim 1, wherein; the first electrode has front and rear surfaces, with the front surface generally facing the second electrode; and the at least one capacitor comprises a plurality of capacitors respectively connected to the first electrode at respective locations spatially distributed over the rear surface of the first electrode.

4. Apparatus according to claim 1, wherein the at least one capacitor has a total capacitance in the range of 750 pf to 3000 pf.

5. Apparatus according to claim 1, wherein the second frequency is at least two times greater than the first frequency.

6. Apparatus according to claim 1, wherein the second frequency is at least ten times greater than the first frequency.

7. Apparatus according to claim 1, wherein the at least one capacitor comprising one capacitor connected to the first electrode at a plurality of spatially distributed locations near the perimeter of the first electrode.

8. Apparatus according to claim 1, wherein: the first electrode has front and rear surfaces, with the front surface generally facing the second electrode; and the at least one capacitor comprises one capacitor connected to the first electrode at a plurality of locations spatially distributed over the rear surface of the first electrode.

9. Apparatus according to claim 1, wherein: the first electrode is in the shape of a rectangle having four corners; and said locations include the four corners of the first electrode.

10. Apparatus according to claim 2, wherein the plurality of capacitors comprises at least four capacitors connected to the first electrode at distinct, spatially distributed locations.

11. Apparatus according to claim 3, wherein the plurality of capacitors comprises at least four capacitors connected to the first electrode at distinct, spatially distributed locations.

12. Apparatus for fabricating a workpiece comprising:
a plasma chamber;
first and second electrodes mounted within the plasma chamber;
a chuck for positioning a workpiece between the first and second electrodes;
a low frequency power supply connected to supply to the first electrode an electrical signal having a first frequency;
a high frequency power supply connected to supply to the second electrode an electrical signal having a second frequency that is substantially higher than the first frequency;
at least one capacitor connected between the first electrode at a plurality of spatially distributed locations on the first electrode, wherein each capacitor is connected between the first electrode and electrical ground;
wherein the spatial distribution of said locations and the respective capacitances of said one or more capacitors are established so as to prevent the formation of any visually apparent plasma hot spots within the plasma chamber.

13. Apparatus for fabricating a workpiece, comprising:
a plasma chamber;
first and second electrodes mounted within the plasma chamber;
a chuck for positioning a workpiece between the first and second electrodes;
a low frequency power supply connected to supply to the first electrode an electrical signal having a first frequency;
a high frequency power supply connected to supply to the second electrode an electrical signal having a second frequency that is substantially higher than the first frequency;
at least one capacitor connected between the first electrode and electrical ground, wherein the at least one capacitor includes a variable capacitor characterized by a capacitance; and
a controller for progressively changing the capacitance of the variable capacitor while said workpiece undergoes a plasma process within the plasma chamber so as to produce within the chamber a plasma having a density whose spatial uniformity is improved relative to what said spatial uniformity would be in the absence of such changing of the capacitance.

14. Apparatus according to claim 13, wherein the second frequency is at least two times greater than the first frequency.

15. Apparatus according to claim 13, wherein the controller changes the capacitance of the variable capacitor as a function of the thickness of a film on the workpiece, wherein said film changes thickness during said plasma process.

16. Apparatus according to claim 13, wherein the second frequency is at least ten times greater than the first frequency.

17. Apparatus according to claim 13, wherein: said plasma process is an etch process for etching a layer on the workpiece; and the controller progressively changes the capacitance of the variable capacitor as a function of the thickness of said layer, wherein said thickness progressively decreases during the etch process.

18. Apparatus according to claim 13, wherein said plasma process is a deposition process for depositing a layer on the workpiece; and the controller progressively changes the capacitance of the variable capacitor as a function of the thickness of said layer wherein said thickness progressively increases during the deposition.

19. Apparatus according to claim 13, wherein the at least one capacitor comprises a plurality of capacitors respectively connected to the first electrode at respective spatially distributed locations near the perimeter of the first electrode.

20. Apparatus according to claim 13, wherein the at least one capacitor comprises one capacitor connected to the first electrode at a plurality of spatially distributed locations near the perimeter of the first electrode.

21. Apparatus according to claim 13, wherein:
the first electrode has front and rear surfaces, with the front surface generally facing the second electrode; and
the at least one capacitor comprises a plurality of capacitors respectively connected to the first electrode at respective locations spatially distributed over the rear surface of the first electrode.

22. Apparatus according to claim 13, wherein:

the first electrode has front and rear surfaces, with the front surface generally facing the second electrode; and the at least one capacitor comprises one capacitor connected to the first electrode at a plurality of locations spatially distributed over the rear surface of the first electrode.

23. Apparatus according to claim 13, wherein:

the first electrode is in the shape of a rectangle having four corners; and said locations include the four corners of the first electrode.

24. Apparatus according to 13, wherein the at least one capacitor has a total capacitance in the range of 750 pf to 3000 pf.

25. Apparatus for fabricating a workpiece, comprising:

a plasma chamber;

first and second electrodes mounted within the plasma chamber;

a chuck for positioning a workpiece between the first and second electrodes;

a low frequency power supply having an output connected to supply to the first electrode an electrical signal having a first frequency;

a high frequency power supply having an output connected to supply to the second electrode an electrical signal having a second frequency that is substantially higher than the first frequency;

at least one capacitor connected between the first electrode and electrical ground, wherein the at least one capacitor includes a variable capacitor characterized by a capacitance; and a controller for changing the capacitance of the variable capacitor as a function of a measurement of the load impedance at the output of one of the two power supplies while said workpiece undergoes a plasma process within the plasma chamber, wherein the controller changes the capacitance so as to maintain said impedance constant during said plasma process.

26. Apparatus according to claim 25, wherein the second frequency is at least ten times greater than the first frequency.

27. Apparatus according to claim 25, wherein the at least one capacitor comprises a plurality of capacitors respectively connected to the first electrode at respective spatially distributed locations near the perimeter of the first electrode.

28. Apparatus according to claim 25, wherein the at least one capacitor comprises one capacitor connected to the first electrode at a plurality of spatially distributed locations near the perimeter of the first electrode.

29. Apparatus according to claim 25, wherein:

the first electrode has front and rear surfaces, with the front surface generally facing the second electrode; and the at least one capacitor comprises a plurality of capacitors respectively connected to the first electrode at respective locations spatially distributed over the rear surface of the first electrode.

30. Apparatus according to claim 25, wherein:

the first electrode has front and rear surfaces, wit the front surface generally facing the second electrode; and the at least one capacitor comprises one capacitor connected to the first electrode at a plurality of locations spatially distributed over the rear surface of the first electrode.

31. Apparatus according to claim 25, wherein:

the first electrode is in the shape of a rectangle having four corners; and said locations include the four corners of the first electrode.

32. Apparatus according to claim 25, wherein the at least one capacitor has a total capacitance in the range of 750 pf to 3000 pf.

33. Apparatus according to claim 25, wherein the second frequency is at least two times greater than the first frequency.

* * * * *